United States Patent
Luo et al.

(10) Patent No.: US 10,600,820 B2
(45) Date of Patent: Mar. 24, 2020

(54) ARRAY SUBSTRATE, LIQUID CRYSTAL DISPLAY AND ELECTRONIC DEVICE

(71) Applicant: SHENZHEN CHINA STAR OPTOELECTRONICS TECHNOLOGY CO., LTD., Shenzhen, Guangdong (CN)

(72) Inventors: Ping Luo, Guangdong (CN); Dong Luo, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/109,476

(22) Filed: Aug. 22, 2018

(65) Prior Publication Data
US 2019/0348445 A1    Nov. 14, 2019

Related U.S. Application Data

(63) Continuation of application No. PCT/CN2018/090443, filed on Jun. 8, 2018.

(30) Foreign Application Priority Data

May 8, 2018  (CN) .......................... 2018 1 0432405

(51) Int. Cl.
*H01L 27/14* (2006.01)
*H01L 29/04* (2006.01)
(Continued)

(52) U.S. Cl.
CPC ........ *H01L 27/1244* (2013.01); *G02F 1/1368* (2013.01); *G02F 1/133345* (2013.01);
(Continued)

(58) Field of Classification Search
None
See application file for complete search history.

(56) References Cited

U.S. PATENT DOCUMENTS

| | | | | |
|---|---|---|---|---|
| 2009/0310048 | A1* | 12/2009 | Shin | G02F 1/136286 349/38 |
| 2010/0110058 | A1* | 5/2010 | Moh | G09G 3/3655 345/211 |
| 2017/0235182 | A1* | 8/2017 | Abe | H01L 27/1248 257/72 |

FOREIGN PATENT DOCUMENTS

| CN | 105573549 A | 5/2016 |
|---|---|---|
| CN | 206727070 U | 12/2017 |

OTHER PUBLICATIONS

International search report dated Dec. 10, 2018 from corresponding application No. PCT/CN2018/090443.

\* cited by examiner

*Primary Examiner* — Calvin Y Choi
(74) *Attorney, Agent, or Firm* — Leong C. Lei

(57) ABSTRACT

The application relates to an array substrate, first metal line, second metal line and common electrode line insulated from each other and stacked in the fan-out area of the array substrate, on any cross section perpendicular to the extension path of first metal line, first metal line comprises a first and a second end in first direction, second metal line does not exceed first end in the first direction, and common electrode line does not exceed second end in the first direction. A staggered and stacked structure formed in the first direction by the second metal line and common electrode line can avoid electric conduction between second metal line and common electrode line in the case of poor cutting and ensure no short circuits occur for the array substrate. The application further relates to a liquid crystal display and an electronic device equipped with above array substrate.

18 Claims, 3 Drawing Sheets

(51) Int. Cl.
  *H01L 29/15*   (2006.01)
  *H01L 31/036*  (2006.01)
  *H01L 27/12*   (2006.01)
  *G02F 1/1362*  (2006.01)
  *G02F 1/1333*  (2006.01)
  *G02F 1/1368*  (2006.01)
(52) U.S. Cl.
  CPC .. *G02F 1/136204* (2013.01); *G02F 1/136286*
       (2013.01); *H01L 27/1248* (2013.01)

ARRAY SUBSTRATE, LIQUID CRYSTAL DISPLAY AND ELECTRONIC DEVICE

RELATED APPLICATION

This application is a continuation application of PCT Patent Application No. PCT/CN2018/090443 filed on Jun. 8, 2018, which claims the priority benefit of Chinese Patent Application No. 201810432405.0, filed on May 8, 2018, which is herein incorporated by reference in its entirety.

FIELD OF THE INVENTION

The application relates to a liquid crystal panel field, in particular to an array substrate with a double layer of metal wiring in a fan-out area, a liquid crystal display equipped with the array substrate and an electronic device equipped with the liquid crystal display.

BACKGROUND OF THE INVENTION

In the environment of general pursuit of narrow frame and large screen occupation ratio in the current liquid crystal display industry, array substrate as an important component of a liquid crystal display has become the main object of our study. A fan-out area is disposed at the edge of an array substrate, and scan signals and data signals can be transmitted to each pixel by a timing controller through wiring in the fan-out area, thus realizing the display function of the liquid crystal display.

To decrease the size of the fan-out area, a double layer of metal wiring is adopted for some array substrates to reduce the total area of the wiring in the fan-out area. That is, two metal wires are arranged in a stacked manner and both connected to the same pixel unit. But the double layer of wiring may cause a short circuit between metal lines and common electrode on the surface and cause damage to the array substrate because of the manufacturing precision of the line width, poor cutting and the like.

SUMMARY OF THE INVENTION

An array substrate with an optimized circuit is provided by the application, which can effectively prevent the formation of a short circuit due to the installation of double layer of metal lines. The application comprises the following technical solutions.

An array substrate comprises a fan-out area, a first metal line, a second metal line and a common electrode line insulated from each other and stacked in the fan-out area, the second metal line is located between the first metal line and the common electrode line, and on any cross section perpendicular to the extension path of the first metal line, the first metal line comprises a first end and a second end in a first direction, the second metal line does not exceed the first end in the first direction, and the common electrode line does not exceed the second end in the first direction.

The length of the second metal line herein in the first direction is the same as that of the first metal line in the first direction.

The length of the common electrode line herein in the first direction is the same as that of the first metal line in the first direction.

On a cross section perpendicular to the extension path of the first metal line, the first metal line herein is trapezoid shaped, where in the trapezoid the two ends of the long side in a pair of parallel sides are respectively the first end and the second end, and the two ends of the short side corresponding to the long side are respectively a third end and a fourth end; wherein the third end is located on the side of the first end, and the second metal line does not exceed the third end in the first direction.

The second metal line herein has a fifth end closest to the third end in the first direction, and the fifth end and the third end are arranged at an interval in the first direction.

The common electrode line herein has a sixth end closest to the fourth end in the first direction, and the sixth end and the fourth end are arranged at an interval in the first direction.

An insulating layer and a semiconductor layer are stacked between the first metal line and the second metal line herein, and the insulating layer is located between the first metal line and the semiconductor layer.

A protective layer herein is stacked between the second metal line and the common electrode line.

The application further relates to a liquid crystal display and an electronic device, and the liquid crystal display comprises the array substrate as described above and is equipped in the electronic device.

In the fan-out area of the array substrate in the application, the data transmission to pixel units are realized by the first metal line and the second metal line insulated from and stacked with each other, an electric field formed between the first metal line and the second metal line is balanced by the common electrode line which is insulated from and stacked with the second metal line, thus avoiding the loading effect. Meanwhile, on any cross section perpendicular to the extension path of the first metal line, the two ends of the first metal line along the first direction (the first end and the second end) are marked, and maintain that the second metal line does not exceed the first end in the first direction and the common electrode line does not exceed the second end in the first direction. This layout ensures that a staggered and stacked structure can be formed in the first direction by the second metal line and the common electrode line, and the second metal line and the common electrode line in a staggered stack configuration can avoid each other to ensure that no short circuits occur for the array substrate if poor cutting appears in the process of the fan-out area, thus improving the yield of the array substrate.

DETAILED DESCRIPTION OF THE INVENTION

Hereinafter, a clear and complete description of the technical solutions in the implementations of the application will be illustrated, which combined with the drawings in the implementations of the application. Apparently, described implementations are merely a portion of implementations of the application, rather than all of the implementations. Base on the implementations of the application, all other implementations obtained by those skilled in the art without creative work are considered to be encompassed within the scope of the application.

Figure 1:
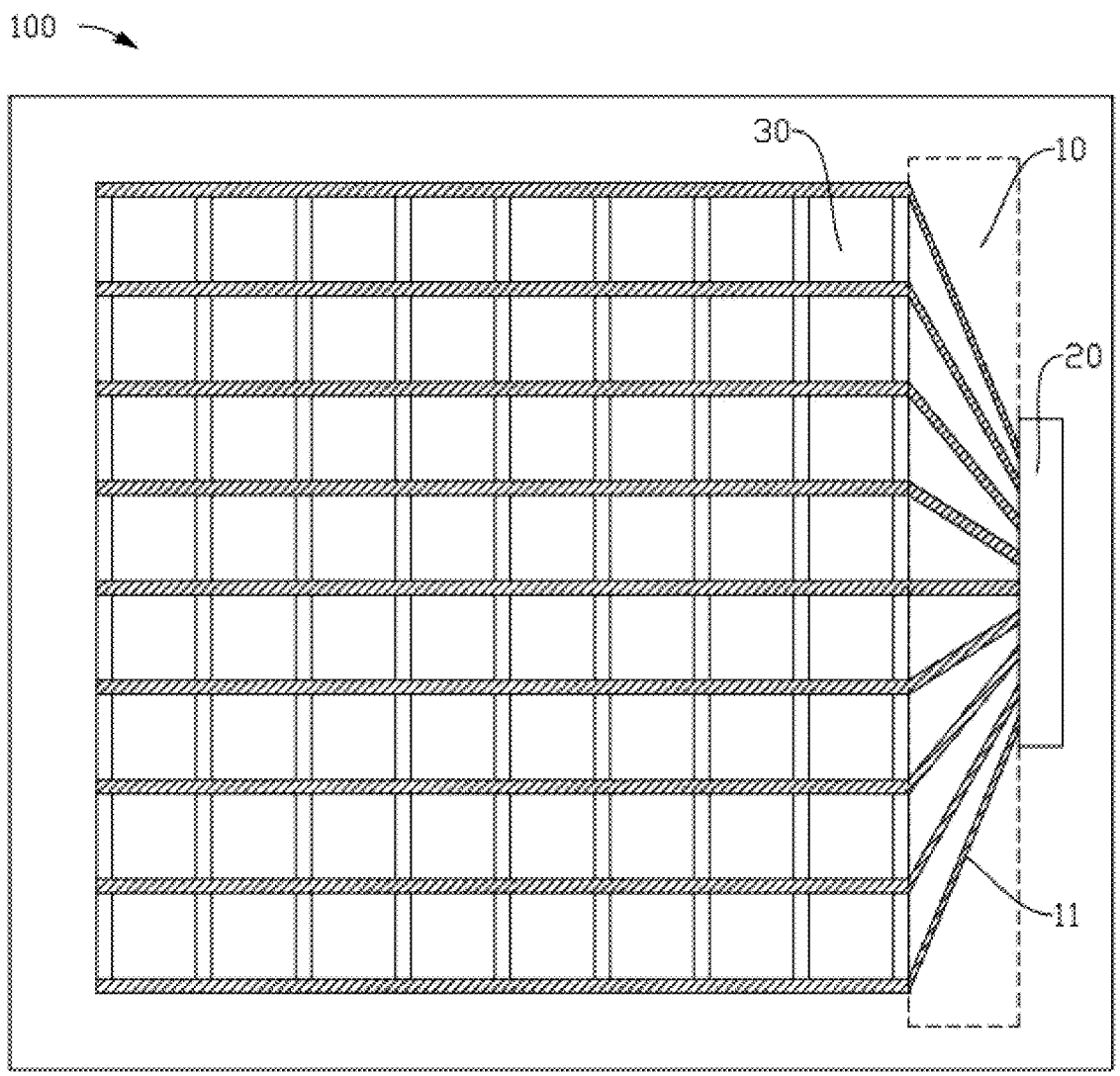
FIG. 1 is a schematic diagram of the array substrate of the application.
Figure 2:
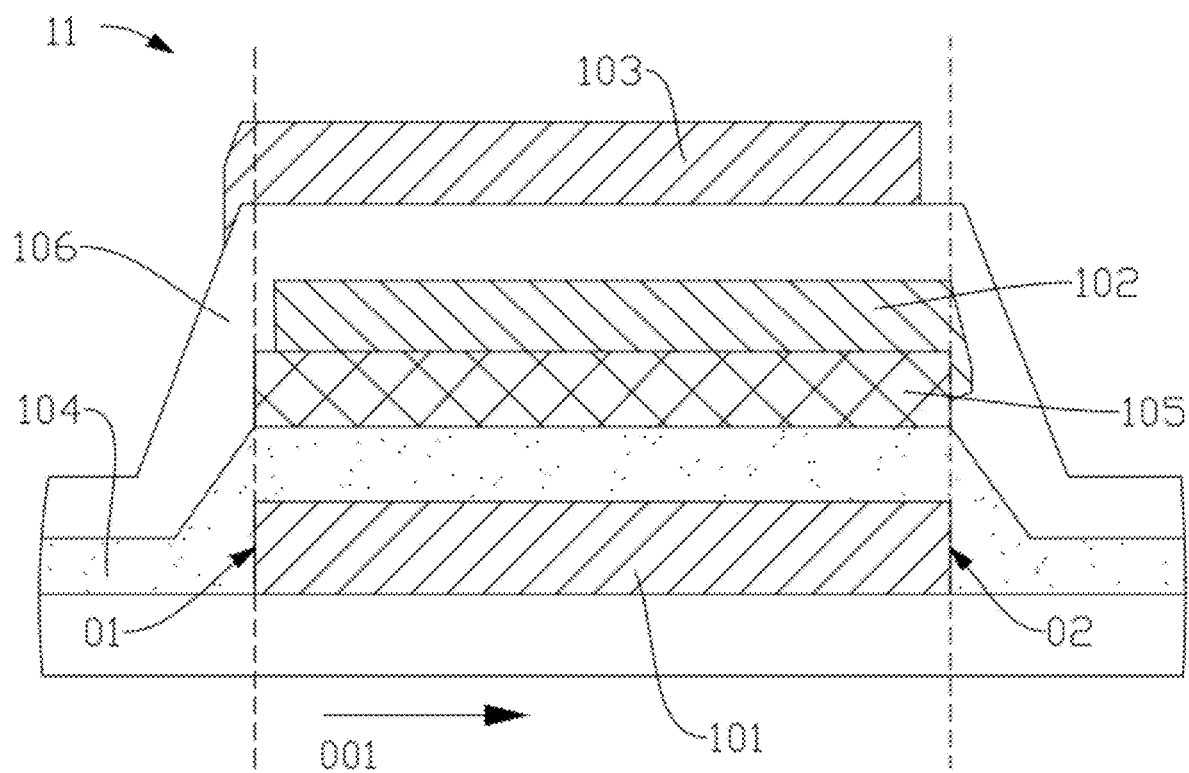
FIG. 2 is a schematic sectional view of the fan-out area of the application.

Please refer to array substrate 100 shown in FIG. 1. Array substrate 100 comprises fan-out area 10. Fan-out area 10 is located at the edge of the display area of array substrate 100. Fan-out area 10 is provided with a plurality of fan-out lines 11, and fan-out lines 11 are used to connect timing controller 20 and pixel unit 30 so that the transmission control of scan signals and data signals of pixel unit 30 can be realized by timing controller 20. Specifically, as for single fan-out line 11 as seen in FIG. 2, fan-out line 11 comprises first metal line 101, second metal line 102 and common electrode line 103 stacked with and insulated from each other. First metal line 101 is connected in parallel with second metal line 102 so as to realize the data transmission function of fan-out line 11. In the implementation shown in FIG. 2, insulating layer 104 and semiconductor layer 105 are stacked between first metal line 101 and second metal line 102, wherein insulating layer 104 is located between first metal line 101 and semiconductor layer 105. Second metal line 102 is located between first metal line 101 and common electrode line 103. Insulating protective layer 106 is stacked between second metal line 102 and common electrode line 103. Understandably, the periphery of the display area of array substrate 100 is provided with fan-out area 10, and scan signals and data signals can be transmitted to each pixel unit by timing controller 20 through fan-out line 11, thus realizing the display function of the liquid crystal display.

Understandably, in another implementation, other layer structures can be stacked between first metal line 101 and second metal line 102, or between second metal line 102 and common electrode line 103, or equivalent substitutions can be made to insulating layer 104, semiconductor layer 105 and protective layer 106. Those shall be belong to the technical scope claimed by array substrate 100 of the application, so long as first metal line 101 is insulated from second metal line 102 in fan-out area 10, or second metal line 102 is insulated from common electrode line 103.

FIG. 2 is an arbitrary section perpendicular to the extension path of fan-out area 11. In the section shown in FIG. 2, first metal line 101 comprises first end 01 and second end 02 in first direction 001. That is, first metal line 101 on first direction 001 has two ends over its length, 01 and 02. Second metal line 102 and common electrode line 103 are stacked on first metal line 101 in a staggered manner, wherein second metal line 102 covering first metal line 101 in first direction 001 does not exceed first end 01, and common electrode line 103 covering first metal line 101 in first direction 001 does not exceed second end 02.

As seen from FIG. 2, second metal line 102 is stacked on insulating layer 104 and semiconductor layer 105. Since first metal line 101 has a thickness, second metal line 102 and insulating layer 104, and semiconductor layer 105 will have at least a slope section. Second metal line 102 needs to be patterned by photolithography process. Since it is difficult to control the precision of photolithography process, it may cause deeper cutting of second metal line 102 on the slope section and damage to semiconductor layer 105 or even insulating layer 104 due to insufficient control precision of the patterning process when second metal line 102 is patterned. Similar poor cutting is called as "undercut" within industry. After undercut happens to fan-out line 11, a notch in a vertical direction will be formed between second metal line 102, semiconductor layer 105 and insulating layer 104. In the manufacturing process of protective layer 106, protective layer 106 is used to cover second metal line 102. But for the notch in a vertical direction, protective layer 106 is often unable to protect second metal line 102. Therefore, if second metal line 102 is covered by common electrode line 103 in first direction 001 during the manufacturing process of common electrode line 103, common electrode line 103 will enter the position of the notch in a vertical direction, thereby causing the electric conduction between common electrode line 103 and second metal line 102. The occurrence of a short circuit failure can thus be caused in entire array substrate 100.

Since second metal line 102 and common electrode line 103 are alternately stacked after adopting array substrate 100 in the present application, so that second metal line 102 is located at first end 01. Since second metal line 102 does not exceed first end 01 in first direction 001, no slope will appear on the position that second metal line 102 exceeds first end 01, and the phenomenon of undercut will further not occur at the location near first end 01. On the other hand, second metal line 102 may also have undercut defects at the position of second end 02, but because common electrode line 103 does not exceed second end 02 in first direction 001, common electrode line 103 will be also not associated with undercut occurring at second end 02, thus the short circuit problem between common electrode line 103 and second metal line 102 is avoided from physical structure. Therefore, array substrate 100 of the application has obtained higher reliability since second metal line 102 and common electrode line 103 are alternately stacked, and short circuit defects caused by undercut is avoided.

In one implementation, the length of second metal line 102 in first direction 001 is the same as that of first metal line 101 in first direction 001. First metal line 101 and second metal line 102 are arranged in parallel and form a connection between timing controller 20 and pixel unit 30. Such arrangement is to reduce the resistance of fan-out area 11 by parallel connection of two metal layers. Understandably, in order to minimize the size of first metal line 101 and second metal line 102, the line width of first metal line 101 and second metal line 102 should be controlled to the narrowest under the limiting conditions of the manufacturing process. That is, the lengths of both first metal line 101 and second metal line 102 in first direction 001 are minimum. On the other hand, when first metal line 101 and second metal line 102 are connected in parallel, the minimum resistance value of the parallel circuit shall appear in the condition that first metal line 101 and second metal line 102 have the same resistance value. That is, the size of first metal line 101 and second metal line 102 in first direction 001 is the same.

Further, in order to minimize the loading effect between first metal line 101 and second metal line 102, the width of common electrode line 103 also needs to be the same as those of first metal line 101 and second metal line 102. That is, the length of common electrode line 103 in first direction 001 is also the same as that of first metal line 101 in first direction 001. On the other hand, common electrode line 103 is made in the same process with a pixel electrode on pixel unit 30 within array substrate 100, and scan line and data line and the like in array substrate 100. Specifically, common electrode line 103 is made during the development process. In order to ensure that the concentration of the developer in the array substrate 100 during the development process is average so as to obtain scan line and data line and the like with the same width, fan-out line 11 with the same width need to be manufactured in fan-out area 10 to prevent the developer with high concentration in fan-out area 10 from affecting the manufacturing precision of array substrate 100. Therefore, the width of common electrode line 103 also needs to be the same as those of first metal line 101 and second metal line 102 in fan-out area 10.

Figure 3:
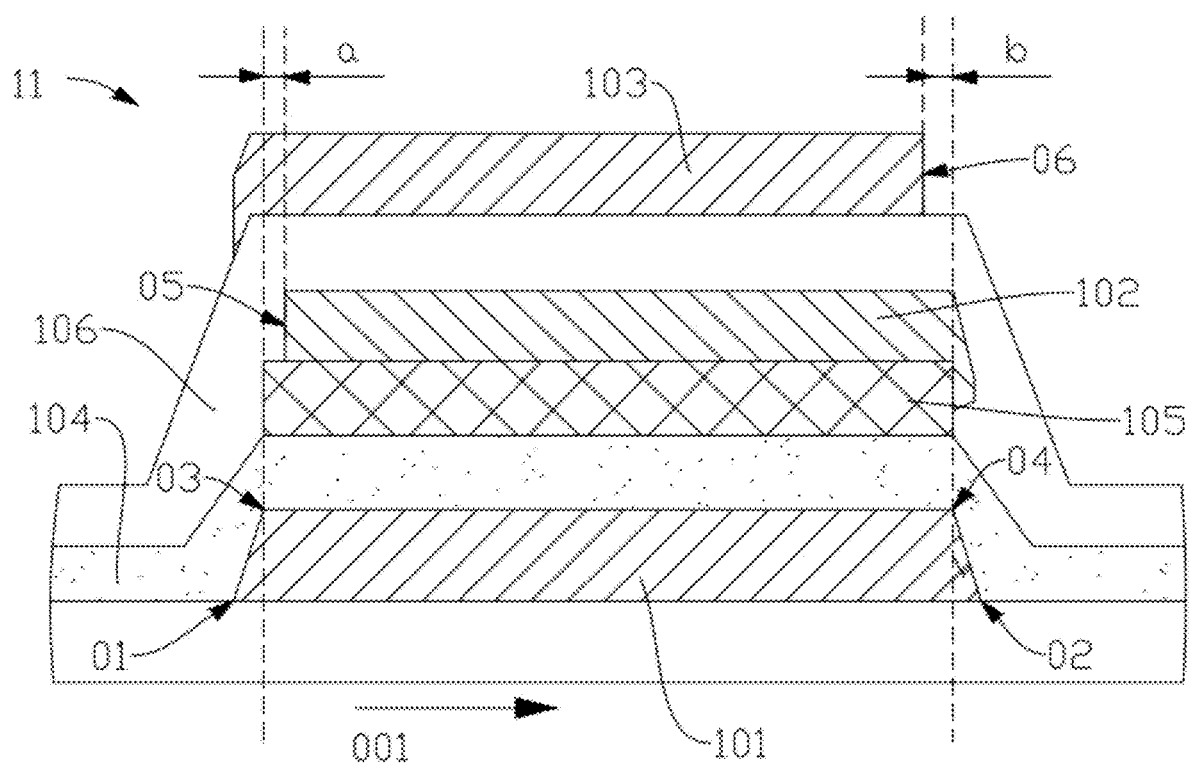
FIG. 3 is a schematic sectional view of the fan-out area in another implementation of the application.

In theory, both first metal line 101 and second metal line 102 shall be made into a rectangle shape on any cross section perpendicular to the extension path of fan-out line 11 so that fan-out line 11 can obtain the best transmission effect. But first metal line 101 and second metal line 102 are always trapezoid shaped (see FIG. 3) on the cross section perpendicular to the extension path of fan-out line 11 due to the limitation of process. The trapezoid has two parallel opposite sides. It is understandable that the two ends of the long side of parallel sides are respectively first end 01 and second end 02. The short side of parallel sides also has two ends, third end 03 and fourth end 04. Third end 03 wherein is located on one side of first end 01, that is, third end 03 is much closer to first end 01 than fourth end 04. Accordingly, Fourth end 04 is located on one side of second end 02. For first metal line 101 and second metal line 102 with actual shape of a trapezoid, The starting point of the staggered and stacked structure of second metal line 102 and common electrode line 103 needs to be adjusted accordingly. That is, second metal line 102 does not exceed third end 03 in first direction 001, and common electrode line 103 does not exceed fourth end 04 in first direction 001. Such arrangement ensures that second metal line 102 and common electrode line 103 in a staggered stack configuration can be implemented strictly.

Further, second metal line 102 has fifth end 05 closest to third end 03 in first direction 001. It is understandable that fifth end 05 is on second metal line 102. To avoid the possible electric conduction between common electrode line 103 and fifth end 05 caused by the presence of undercut at fifth end 05 when fifth end 05 coincides with third end 03, fifth end 05 needs to be spaced at a distance called as a, from third end 03 in first direction 001.

Accordingly, common electrode line 103 has sixth end 06 closest to fourth end 04 in first direction 001. Sixth end 06 is one end of common electrode line 103. Sixth end 06 is also spaced from fourth end 04 in first direction 001 at a distance called as b. Understandably, if undercut appears at fourth end 04 and sixth end 06 coincides with fourth end 04, there is still a hidden danger of the electric conduction between common electrode 103 and second metal wire 102 at sixth end 06. But such extreme situation can be avoided when sixth end 06 is spaced from fourth end 04 at a distance.

The application further relates to a liquid crystal display and an electronic device, wherein the liquid crystal display comprises array substrate 100 of the application, and the electronic device comprises the liquid crystal display equipped with array substrate 100. Understandably, since the liquid crystal display is equipped with array substrate 100, the short circuit problem of fan-out line 11 in fan-out area 10 caused by undercut can be controlled, the liquid crystal display and the electronic device equipped with the liquid crystal display can both have higher reliability and longer service life due to array substrate 100.

It is understandable that the electronic device involved in the implementations of the application can be any device with communication and storage functions, such as a panel computer, phone, e-reader, remote control, personal computer (PC), laptop, or wearable device and other intelligent devices with network function.

The above implementations do not limit the protection scope of the technical solutions of the present application. Any modification, equivalent replacement and improvement and etc. within the spirit and principle of above implementations should be included in the protection scope of the technical solutions.

What is claimed is:

1. An array substrate, wherein the array substrate comprises a fan-out area, a first metal line, a second metal line and a common electrode line insulated from each other and stacked in the fan-out area, the second metal line is located between the first metal line and the common electrode line, and on any cross section perpendicular to the extension path of the first metal line, the first metal line comprises a first end and a second end in a first direction, the second metal line does not exceed the first end in the first direction, and the common electrode line does not exceed the second end in the first direction; wherein on a cross section perpendicular to the extension path of the first metal line, the first metal line is trapezoid shaped, the two ends of the long side in a pair of parallel sides of the trapezoid are respectively the first end and the second end, the two ends of the short side corresponding to the long side are respectively a third end and a fourth end; wherein the third end is located on one side of the first end, and the second metal line does not exceed the third end in the first direction.

2. The array substrate as claimed in claim 1, wherein the length of the second metal line in the first direction is the same as that of the first metal line in the first direction.

3. The array substrate as claimed in claim 1, wherein an insulating layer and a semiconductor layer are stacked between the first metal line and the second metal line, and the insulating layer is located between the first metal line and the semiconductor layer.

4. The array substrate as claimed in claim 2, wherein the length of the common electrode line in the first direction is the same as that of the first metal line in the first direction.

5. The array substrate as claimed in claim 2, wherein an insulating layer and a semiconductor layer are stacked between the first metal line and the second metal line, and the insulating layer is located between the first metal line and the semiconductor layer.

6. The array substrate as claimed in claim 4, wherein an insulating layer and a semiconductor layer are stacked between the first metal line and the second metal line, and the insulating layer is located between the first metal line and the semiconductor layer.

7. The array substrate as claimed in claim 1, wherein the second metal line has a fifth end closest to the third end in the first direction, and the fifth end and the third end are arranged at an interval in the first direction.

8. The array substrate as claimed in claim 1, wherein the common electrode line has a sixth end closest to the fourth end in the first direction, and the sixth end and the fourth end are arranged at an interval in the first direction.

9. The array substrate as claimed in claim 1, wherein an insulating layer and a semiconductor layer are stacked between the first metal line and the second metal line, and the insulating layer is located between the first metal line and the semiconductor layer.

10. The array substrate as claimed in claim 3, wherein a protective layer is stacked between the second metal line and the common electrode line.

11. A liquid crystal display, wherein the liquid crystal display comprises an array substrate, the array substrate comprises a fan-out area, a first metal line, a second metal line and a common electrode line insulated from each other and stacked in the fan-out area, the second metal line is located between the first metal line and the common electrode line, and on any cross section perpendicular to the extension path of the first metal line, the first metal line comprises a first end and a second end in a first direction, the second metal line does not exceed the first end in the first direction, and the common electrode line does not exceed the second end in the first direction; wherein the on a cross section perpendicular to the extension path of the first metal line, the first metal line is trapezoid shaped, the two ends of the long side in a pair of parallel sides of the trapezoid are respectively the first end and the second end, the two ends of the short side corresponding to the long side are respectively a third end and a fourth end; wherein the third end is located on one side of the first end, and the second metal line does not exceed the third end in the first direction.

12. The liquid crystal display as claimed in claim 11, wherein the length of the second metal line in the first direction is the same as that of the first metal line in the first direction.

13. The liquid crystal display as claimed in claim 12, wherein the length of the common electrode line in the first direction is the same as that of the first metal line in the first direction.

14. The liquid crystal display as claimed in claim 11, wherein the second metal line has a fifth end closest to the third end in the first direction, and the fifth end and the third end are arranged at an interval in the first direction.

15. The liquid crystal display as claimed in claim 11, wherein the common electrode line has a sixth end closest to the fourth end in the first direction, and the sixth end and the fourth end are arranged at an interval in the first direction.

16. The liquid crystal display as claimed in claim 11, wherein an insulating layer and a semiconductor layer are stacked between the first metal line and the second metal line, and the insulating layer is located between the first metal line and the semiconductor layer.

17. The liquid crystal display as claimed in claim 16, wherein a protective layer is stacked between the second metal line and the common electrode line.

18. An electronic device, wherein the electronic device comprises the liquid crystal display as claimed in claim 11.

\* \* \* \* \*